(12) United States Patent
Zhu et al.

(10) Patent No.: US 9,755,680 B2
(45) Date of Patent: Sep. 5, 2017

(54) CIRCUITS FOR FIELD-PROGRAMMABLE RECEIVER FRONT ENDS

(71) Applicants: Jianxun Zhu, New York, NY (US); Peter R. Kinget, Summit, NJ (US)

(72) Inventors: Jianxun Zhu, New York, NY (US); Peter R. Kinget, Summit, NJ (US)

(73) Assignee: The Trustees of Columbia University in the City of New York, New York, NY (US)

( * ) Notice: Subject to any disclaimer, the term of this patent is extended or adjusted under 35 U.S.C. 154(b) by 0 days.

(21) Appl. No.: 15/276,308

(22) Filed: Sep. 26, 2016

(65) Prior Publication Data

US 2017/0093449 A1 Mar. 30, 2017

Related U.S. Application Data

(60) Provisional application No. 62/233,065, filed on Sep. 25, 2015.

(51) Int. Cl.
| | |
|---|---|
| *G06F 3/033* | (2013.01) |
| *H04B 1/16* | (2006.01) |
| *H03F 3/45* | (2006.01) |
| *H03F 3/19* | (2006.01) |

(52) U.S. Cl.
CPC ............ *H04B 1/1638* (2013.01); *H03F 3/19* (2013.01); *H03F 3/45179* (2013.01); *H03F 2200/294* (2013.01); *H03F 2200/336* (2013.01); *H03F 2200/451* (2013.01); *H03F 2203/45288* (2013.01)

(58) Field of Classification Search
USPC .................................................. 455/130–355
See application file for complete search history.

(56) References Cited

U.S. PATENT DOCUMENTS

| | | | |
|---|---|---|---|
| 7,006,583 B2 | 2/2006 | Ho et al. | |
| 7,299,020 B2 | 11/2007 | Shen et al. | |
| 7,447,491 B2* | 11/2008 | Khoini-Poorfard | ...... H04B 1/30 455/209 |
| 7,792,513 B2 | 9/2010 | Safarian et al. | |
| 8,577,325 B2* | 11/2013 | Lee | ........ H03F 1/0261 330/277 |

(Continued)

OTHER PUBLICATIONS

Andrews, C. and Molnar, A., "A Passive Mixer-First Receiver with Digitally Controlled and Widely Tunable RF Interface", In IEEE Journal of Solid-State Circuits, vol. 45, No. 12, Oct. 2010, pp. 2696-2708.

(Continued)

*Primary Examiner* — Lana N Le
(74) *Attorney, Agent, or Firm* — Byrne Poh LLP (57) ABSTRACT

Circuits for field-programmable receiver front ends are provided. These front ends can include a field programmable common source low noise transconductance amplifier (LNTA), a field programmable common gate LNTA, first and second four-phase I/Q mixers, first, second, third, and fourth transimpedance amplifiers, an I-path complex combiner, and a Q-path complex combiner. Transconductance cells in each of the field programmable common source LNTA and field programmable common gate LNTA can be programmed to operate in one of a class-AB mode, a class-C mode, and an OFF mode.

13 Claims, 6 Drawing Sheets

(56) References Cited

U.S. PATENT DOCUMENTS

| | | | | |
|---|---|---|---|---|
| 9,219,507 | B2* | 12/2015 | Rofougaran | H04B 1/10 |
| 9,407,296 | B2* | 8/2016 | Rajapandian | H04B 1/18 |
| | | | | 455/313 |
| 9,525,447 | B1* | 12/2016 | Wu | H04B 1/16 |
| | | | | 455/130 |
| 2010/0316172 | A1* | 12/2010 | Keehr | H04B 1/109 |
| | | | | 375/344 |
| 2013/0136211 | A1* | 5/2013 | Jussila | H04B 1/0075 |
| | | | | 455/341 |
| 2014/0355728 | A1* | 12/2014 | Liao | H04B 1/10 |
| | | | | 375/346 |
| 2015/0162940 | A1* | 6/2015 | Mikhemar | H04B 1/18 |
| | | | | 455/284 |
| 2017/0026066 | A1* | 1/2017 | Kinget | H04B 1/1027 |
| | | | | 455/130 |

OTHER PUBLICATIONS

Borremans, J. et al., "A 0.9V Low-Power 0.4-6GHz Linear SDR Receiver in 28nm CMOS", In Digest of Technical Papers Symposium on VLSI Circuits, Jun. 2013, pp. C146-C147.

Chen, R. and Hashemi, H., "A 0.5-to-3 GHz Software-Defined Radio Receiver using Sample Domain Signal Processing", In IEEE Radio Frequency Integrated Circuits Symposium, Seattle, WA, US, Jun. 2-4, 2013, pp. 315-318.

Hedayati, H. et al., "A 1.8 dB NF Blocker-Filtering Noise-Canceling Wideband Receiver with Shared TIA in 40nm CMOS", In IEEE Radio Frequency Integrated Circuits Symposium, Tampa, FL, US, Jun. 1-3, 2014, pp. 325-328.

Klumperink, E. and Nauta, B., "Software Defined Radio Receiver Exploiting Noise Cancelling: A Tutorial Review", In IEEE Communications Magazine, vol. 52, No. 10, Oct. 2014, pp. 111-117.

Mehrpoo, M. and Staszewski, R.B., "A Highly Selective LNTA Capable of Large-Signal Handling for RF Receiver Front-Ends", In IEEE Radio Frequency Integrated Circuits Symposium, Seattle, WA, US, Jun. 2-4, 2013, pp. 185-188.

Murphy, D. et al., "A Blocker-Tolerant, Noise-Cancelling Receiver Suitable for Wideband Wireless Applications", In IEEE Journal of Solid-State Circuits, vol. 47, No. 12, Dec. 2012, pp. 2943-2963.

Zhang, H. and Sanchez-Sinencio, E., "Linearization Techniques for CMOS Low Noise Amplifiers: A Tutorial", In IEEE Transactions on Circuits Systems, I, Jan. 2011, pp. 22-36.

Zhou, J. et al., "Low-Noise Active Cancellation of Transmitter Leakage and Transmitter Noise in Broadband Wireless Receivers for FDD/Co-Existance", In IEEE Journal of Solid-State Circuits, vo. 49, No. 12, Dec. 2014, pp. 3046-3062.

\* cited by examiner

CIRCUITS FOR FIELD-PROGRAMMABLE RECEIVER FRONT ENDS

CROSS-REFERENCE TO RELATED APPLICATION

This application claims the benefit on United States Provisional Patent Application No. 62/233,065, filed Sep. 25, 2015, which is hereby incorporated by reference herein in its entirety.

STATEMENT REGARDING GOVERNMENT FUNDED RESEARCH

This invention was made with government support under Grant #: HR0011-12-1-0006 awarded by the Department of Defense, Defense Advanced Research Projects Agency. The government has certain rights in the invention.

BACKGROUND

Modern wireless receivers need to support multiple standards at different frequencies, with varying sensitivity and linearity requirements.

Accordingly, it is desirable to provide wideband receiver front ends that can be programmed in the field for different applications.

SUMMARY

Circuits for field-programmable receiver front ends are provided. In accordance with some embodiments, circuits for a field-programmable receiver front ends are provided, the circuits comprising: a field programmable common source low noise transconductance amplifier (LNTA) having an input coupled to an input signal and producing a first output; a field programmable common gate LNTA having an input coupled to the input signal and producing a second output; a first four-phase I/Q mixer having an input coupled to the first output and producing first differential I outputs and first differential Q outputs; a second four-phase I/Q mixer having an input coupled to the second output and producing second differential I outputs and second differential Q outputs; a first transimpedance amplifier (TIA) having inputs coupled to the first differential I outputs and producing first differential TIA outputs; a second TIA having inputs coupled to the first differential Q outputs and producing second differential TIA outputs; a third TIA having inputs coupled to the second differential I outputs and producing third differential TIA outputs; a fourth TIA having inputs coupled to the second differential Q outputs and producing fourth differential TIA outputs; an I-path complex combiner that combines the first differential TIA outputs, the second differential TIA outputs, the third differential TIA outputs, and the fourth differential TIA outputs and that produces combiner I-path outputs; and a Q-path complex combiner that combines the first differential TIA outputs, the second differential TIA outputs, the third differential TIA outputs, and the fourth differential TIA outputs and that produces combiner Q-path outputs.

In accordance with some embodiments, circuits for a field-programmable noise cancelling wideband receiver front end are provided, the circuits comprising: a field programmable common source low noise transconductance amplifier (LNTA) comprising: a plurality of parallel transconductance cells, wherein at least one of the plurality of parallel transconductance cells has a bias input coupled to a first bias voltage that puts the cell in a class-AB mode and wherein at least one other of the plurality of parallel transconductance cells has a bias input coupled to a second bias voltage that puts the cell in a class-C mode.

In accordance with some embodiments, circuits for a field-programmable noise cancelling wideband receiver front end are provided, the circuits comprising: a field programmable common gate LNTA comprising: a plurality of parallel transconductance cells, wherein at least one of the plurality of parallel transconductance cells has a bias input coupled to a first bias voltage that puts the cell in a class-AB mode and wherein at least one other of the plurality of parallel transconductance cells has a bias input coupled to a second bias voltage that puts the cell in a class-C mode.

DETAILED DESCRIPTION

Circuits for field-programmable receiver front ends are provided. In accordance with some embodiments, wideband, noise canceling, field-programmable receiver front ends using high-linearity hybrid class-AB-C low noise transconductance amplifiers (LNTAs) in common-source (CS) and common-gate (CG) configurations are provided. Each LNTA includes parallel transconductance (Gm) cells whose bias point can be individually programmed in class AB or C yielding a highly linear hybrid class-AB-C LNTA. With this feature, the receiver can be programmed to work in different modes to optimize noise factor (NF), linearity and power consumption to adapt to the radio frequency (RF) signal environment or standard.

Figure 1:
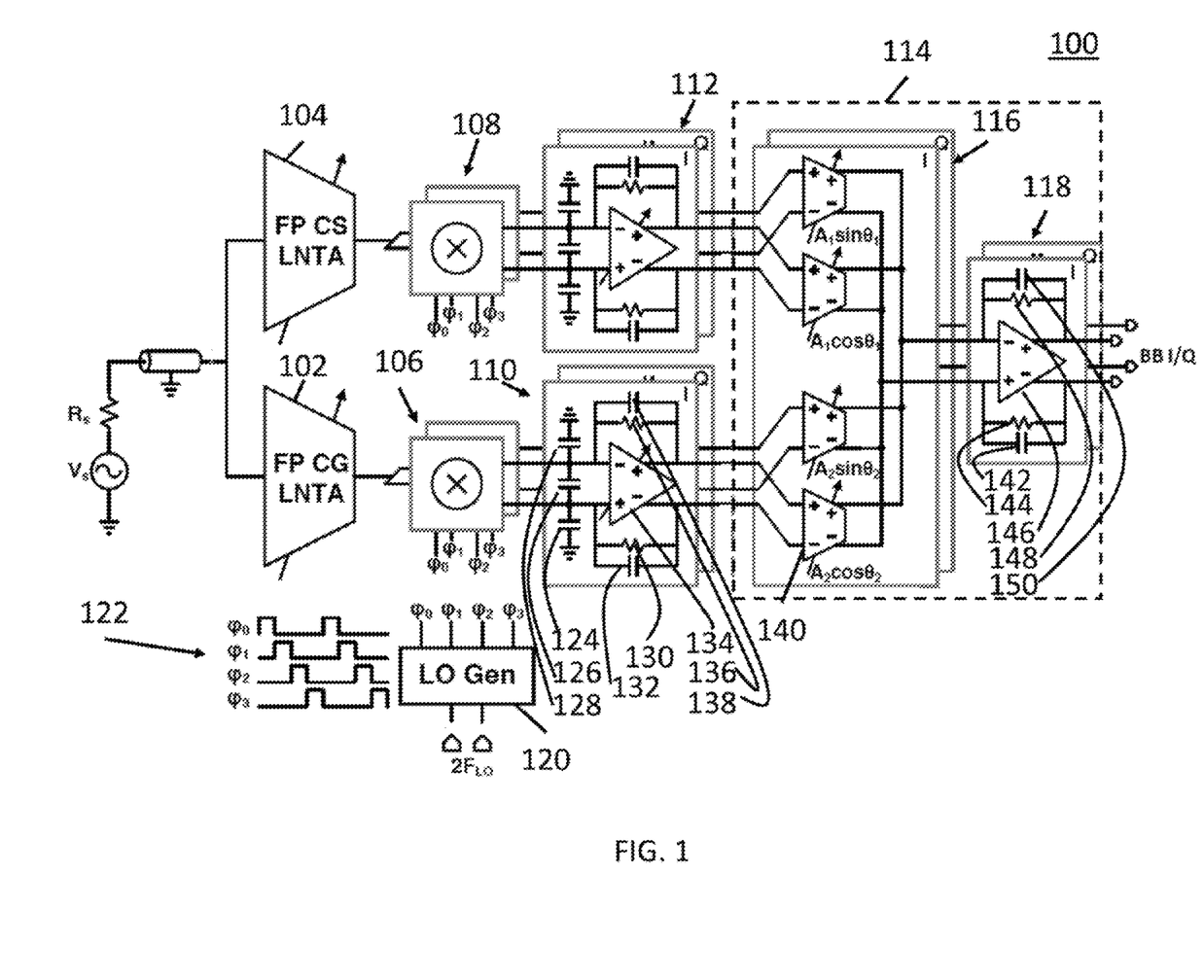
FIG. 1 shows an example of a wide-band, noise canceling, field programmable receiver front end in accordance with some embodiments.

A schematic of an example 100 of a receiver front end in accordance with some embodiments is shown in FIG. 1. As illustrated, receiver front end 100 includes a field programmable (FP) CG LNTA 102, a FP CS LNTA 104, mixers 106 and 108, transimpedance amplifiers (TIAs) 110 and 112, a complex Cartesian combiner 114, and a local oscillator (LO) generator 120.

FP CG LNTA 102 and FP CS LNTA 104 can be implemented in any suitable manner in some embodiments. For example, in some embodiments, FP CG LNTA 102 and FP CS LNTA 104 can be implemented as described below in connection with FIG. 2.

In some embodiments, FP CG LNTA 102 can provide wideband input matching with reverse isolation to limit local oscillator (LO) leakage. The noise of the FP CG LNTA 102 can be sensed by FP CS LNTA 104 and canceled in the complex baseband, and the receiver noise factor (NF) can be dominated by the FP CS LNTA, in some embodiments.

Mixers 106 and 108 can be any suitable mixers, such as I/Q single balanced current-driven four-phase passive mixers, in some embodiments.

In some embodiments, one of mixers 106 can mix the output of FP CG LNTA 102 with LO signals ϕ0 and ϕ2 to form a differential I channel. Another of mixers 106 can mix the output of FP CG LNTA 102 with LO signal ϕ1 and ϕ3 to form a differential Q channel. One of mixers 108 can mix the output of FP CS LNTA 104 with LO signals ϕ0 and ϕ2 to form a differential I channel. Another of mixers 108 can mix the output of FP CS LNTA 104 with LO signal ϕ1 and ϕ3 to form a differential Q channel.

TIAs 110 and 112 can be implemented in any suitable manner in some embodiments. For example, as shown in FIG. 1, each of TIAs 110 and 112 can be implemented using capacitors 124, 126, 128, 132, and 138, resistors 130 and 136, and a variable operational amplifier 134. Any suitable values of the capacitors and resistors can be used in some embodiments.

In some embodiments, the down-converted current signals output by mixers 106 and 108 can be filtered and amplified by TIAs 110 and 112 and then combined with appropriate phase and gain adjustments by complex Cartesian combiner 114.

As shown, in some embodiments, combiner 114 can include banks 116 of variable transconductors that can weight and combine the outputs of the TIAs under the control of a controller (not shown). Combiner 114 can also include transimpedance amplifiers (TIAs) 118 that can receive the outputs of banks 116 and convert the provided current signals to voltage signals.

TIAs 118 can be implemented in any suitable manner. For example, as shown in FIG. 1, TIAs 118 can be implemented using capacitors 142 and 150, resistors 144 and 148, and an operational amplifier 146. Any suitable values of the capacitors and resistors can be used in some embodiments.

As shown by timing diagram 122, in some embodiments, the LO signals ϕ0, ϕ1, ϕ2, and ϕ3 used by mixers 106 and 108 can each be one of four non-overlapping, phase shifted, 25%-duty-cycle clocks generated by LO generator 120, which can be a divide-by-2 circuit in some embodiments.

In some embodiments, LNTAs 102 and 104 can be DC coupled to mixers 106 and 108, respectively, to reduce the load impedance seen by the LNTAs.

Figure 2:
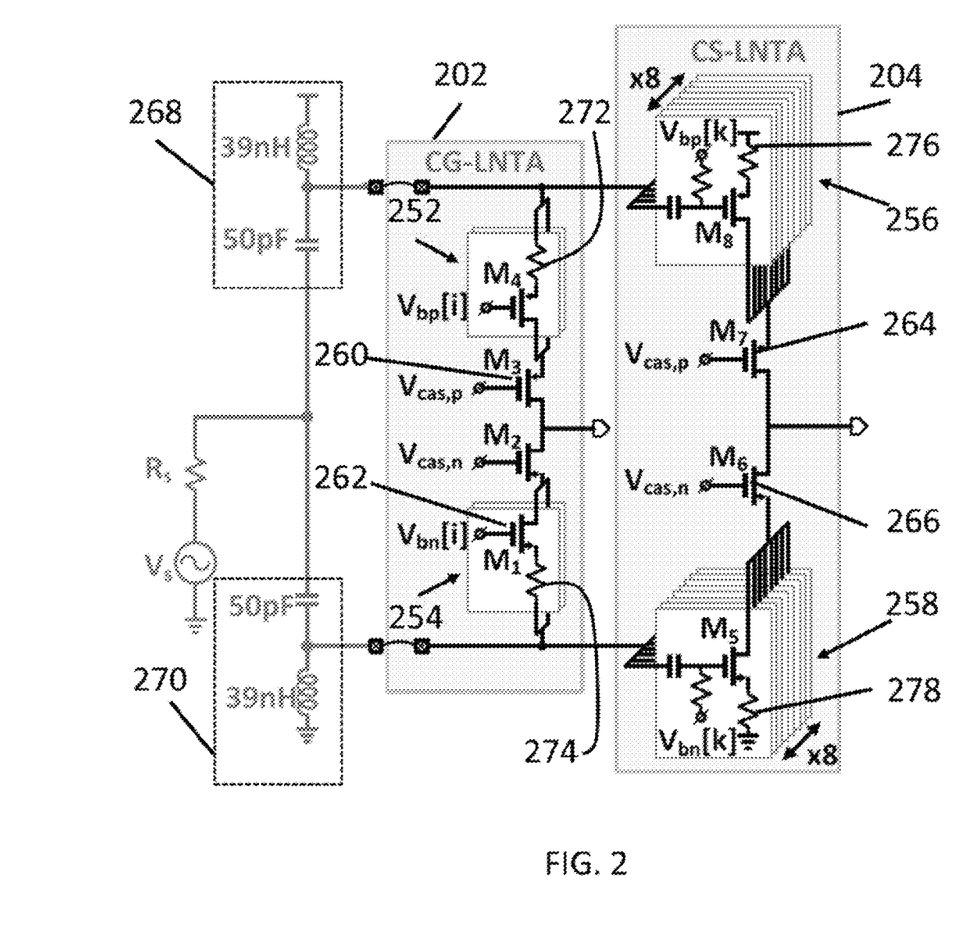
FIG. 2 shows examples of a field programmable common gate low noise transconductance amplifier and a field programmable common source low noise transconductance amplifier in accordance with some embodiments.

Turning to FIG. 2, examples 202 and 204 of circuits that can be used to implement CG LNTA 102 (FIG. 1) and CS LNTA 104 (FIG. 1), respectively, in accordance with some embodiments are shown.

As illustrated, in some embodiments, CG LNTA 202 can include two (or any other suitable number) parallel transconductance (Gm) cells 252 and 254 (which can each have any suitable transconductance, such 30 mS) and CS LNTA 204 can include eight (or any other suitable number) parallel Gm cells 256 and 258 (which can each have any suitable transconductance, such 20 mS). As also illustrated, in some embodiments, the CG LNTAs and the CS LNTAs can use both NMOS circuits (254 and 258, respectively) and PMOS circuits (252 and 256, respectively) to contribute to the transconductances of the LNTAs.

CG LNTA 202 and CS LNTA 204 can also include cascode transistors 260 and 262 and cascode transistors 264 and 266, respectively. These cascode transistors can buffer the signals produced by the transconductance cells and provide a high output impedance. Vcas,n and Vcas,p can be generated by two independent bias voltage generators in some embodiments.

In some embodiments, the CG LNTA can use two choke inductors 268 and 270 to provide DC bias currents.

In some embodiments, each of the Gm cells 252, 254, 256, and 258 can be biased with a bias voltage (Vbp[i], Vbn[i], Vbp[k], and Vbn[k], respectively) to put the Gm cell in one of three different modes: class-AB; class-C; and OFF. In class-AB mode, the transistor of the Gm cell is biased in strong inversion. In class-C mode, the transistor is biased in deep weak inversion. And in the OFF mode, the $|V_{GS}|$ set to 0V. (When biased in class-C mode, a CS Gm cell may not be completely off, but instead may have a small transconductance $g_m$ (e.g., 50 µS).)

Figure 3:
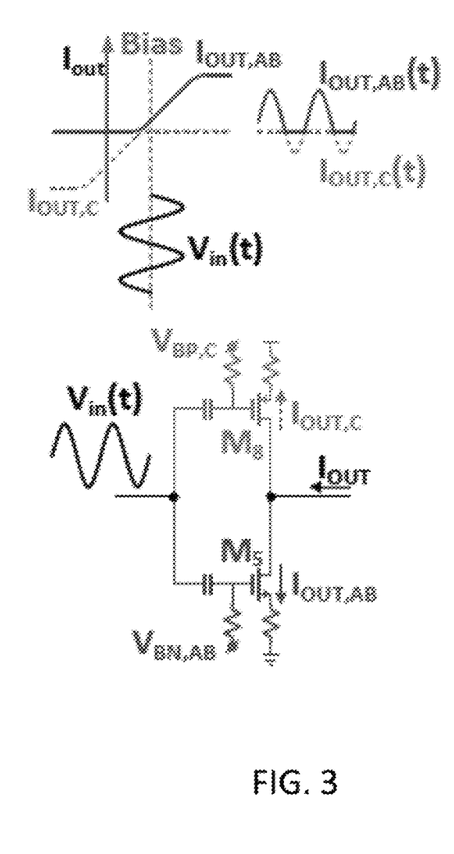
FIG. 3 shows an example of the operation of hybrid class-AB-C LNTA in accordance with some embodiments.

FIG. 3 shows an example of an NMOS CS Gm cell that is biased in class-AB mode. When Vin(t) goes more than ($V_G$S-Vth) below its gate bias, the NMOS transistor (M5) turns off resulting in hard clipping and strongly non-linear LNTA transfer curves as shown by $I_{OUT,AB}$. Using a higher ($V_{GS}$-Vth) increases the input swing range, but at a cost of a lower ratio of transconductance to drain current ($g_m/I_D$) and thus reduced power efficiency.

To overcome this limitation, in some embodiments, a PMOS CS Gm cell (that is biased in class-C mode such that it turns ON and pushes out current $I_{OUT,C}$ when the NMOS is cut off) can be used. The combined transfer curve as shown by $I_{OUT,AB}$ and $I_{OUT,C}$ of the NMOS Gm and the PMOS Gm can exhibit an almost twice-as-large linear amplification region and the input clipping non-linearity can be removed, resulting in a significantly higher tolerance to input blocking signals, in some embodiments.

Referring back to FIG. 2, in some embodiments, to reduce even order distortion in the combined transfer curve due to mobility mismatch between NMOS cells and PMOS cells, source degeneration resistors 272, 274, 276, and 278 can be used in Gm cells 252, 254, 256, and 258, respectively. A source degeneration resistor value equal to 1/(transconductance $g_m$ of the transistors) can be used in some embodiments. In some embodiments, all source degeneration resistors can be of the same type and size. Using source degeneration resistors can improve the matching of the transconductances of the P cells and the N cells across class-AB mode and class-C mode operation, improve their small-signal linearity, and reduce the voltage swing on the transistor to half the input swing so that reliability is improved, in some embodiments.

Figure 4:
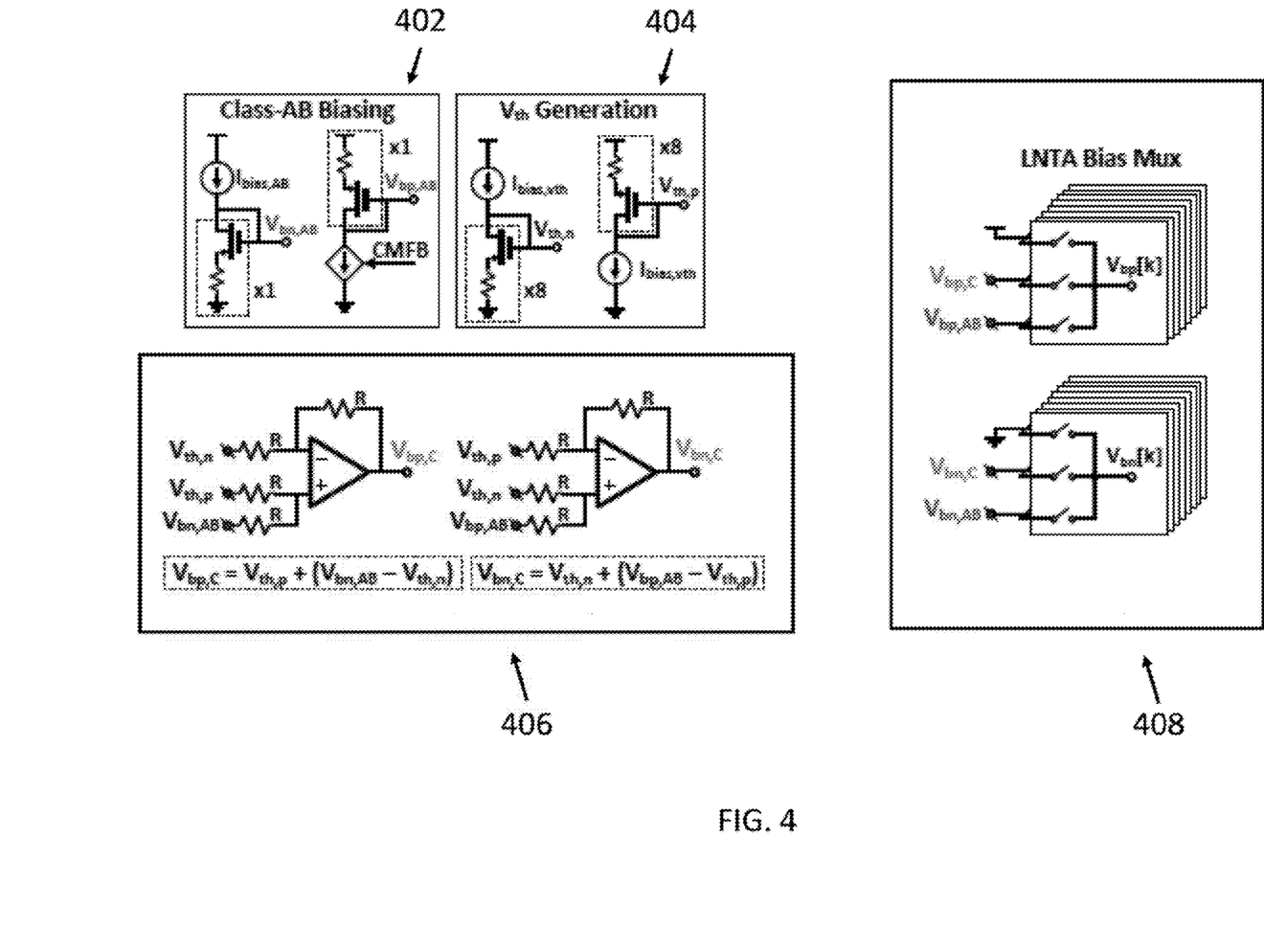
FIG. 4 shows examples of bias voltage generator circuits and a bias multiplexer in accordance with some embodiments.

FIG. 4 shows examples of circuits for generating bias voltages in accordance with some embodiments.

As illustrated, circuits 402 can be used to generate class-AB bias voltages $V_{bp,AB}$ and $V_{bn,AB}$ for P cells and N cells, respectively, in some embodiments. The class-AB bias voltages are generated with current mirrors formed by the transistors shown in circuits 402 and the transistors (e.g., as shown in FIG. 2) to which their gates are connected.

As also illustrated, circuits 404 can be used to generate threshold voltages $V_{th,p}$ and $V_{th,n}$ for P cells and N cells, respectively, in some embodiments. As shown in FIG. 4, eight (or any other suitable number, including one) parallel cells, each containing a resistor and a transistor, can be used in circuits 404 to provide $V_{th,p}$ and $V_{th,n}$.

As illustrated in circuits 406, the class-C bias voltages $V_{bp,C}$ and $V_{bn,C}$ can be derived from the class-AB bias voltages $V_{bp,AB}$ and $V_{bn,AB}$ and the threshold voltages $V_{th,p}$ and $V_{th,n}$ of the PMOS cells and the NMOS cells, respectively, in some embodiments. The operational amplifiers in circuits 406 can generate the class-C bias voltages according to the equations shown in FIG. 4, in some embodiments.

LNTA bias multiplexers 408 can be used to select the bias voltage delivered to each Gm cell in the CS LNTA. Similar multiplexers can be provided for the CG LNTA. These multiplexers can be controlled by any suitable component, such as a controller.

The flexible LNTA architecture has a large number of possible biasing combinations which makes a dynamic trade-off between LNTA noise and linearity performance and power consumption possible in the field. Any suitable combinations can be used in some embodiments.

In some embodiments, to maintain balance in the DC bias current, the number of class-AB NMOS cells can be matched to the number of class-AB PMOS cells. Additionally, in some embodiments, if class-C cells are used, their number can be matched with an equal number of class-AB cells.

Figure 5:
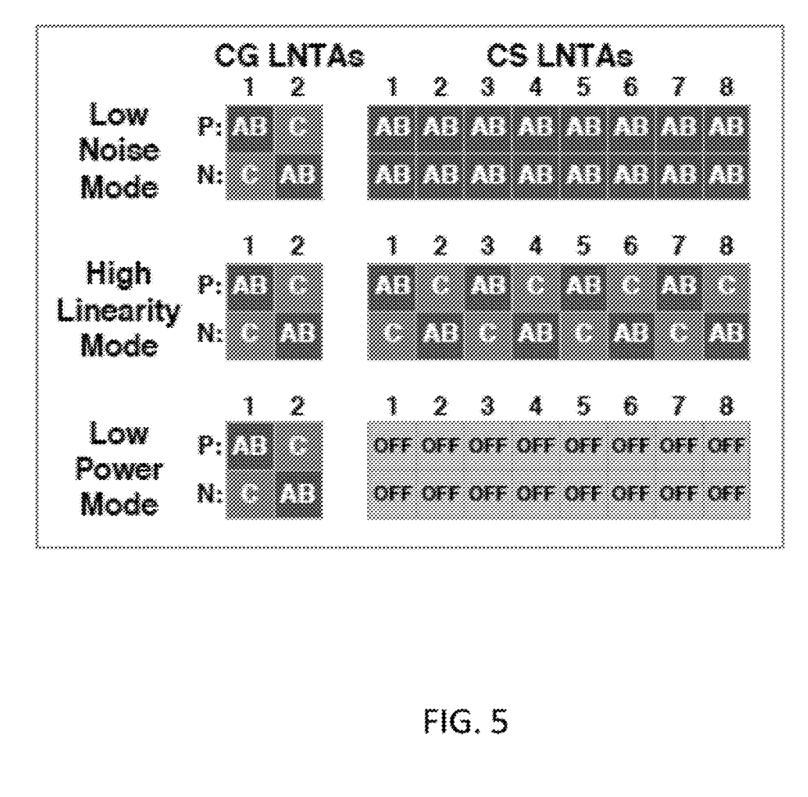
FIG. 5 shows example configurations of transconductance cells in different modes of operation in accordance with some embodiments.

As shown in FIG. 5, three modes of operation of the circuits described herein are illustrated. Other modes of operation can also be used in some embodiments.

In the modes of operation illustrated in FIG. 5, the CG Gm cells can be kept in a hybrid class-AB +class-C mode, while the configuration of the CS Gm cells can be changed.

In a low noise mode, in accordance with some embodiments, when there are no extremely large blockers present and the highest sensitivity is desired, all eight Gm cells of the CS LNTA can be programmed with class-AB bias to maximize the CS branch Gm at the expenses of increased power dissipation.

In a high linearity mode, in accordance with some embodiments, when large out-of-band blockers appear at the input, the CS LNTA can be programmed into a high-linearity mode with half the cells biased in class-AB and the other half in class-C to handle the large blocker without compression. In some embodiments, the noise factor may degrade slightly due to lower Gm and conversion gain.

In a low power mode, in accordance with some embodiments, when in a benign RF environment with moderate blockers and a strong desired signal, the CS path can be shut down to save power at the cost of an increased noise factor.

Figure 6:
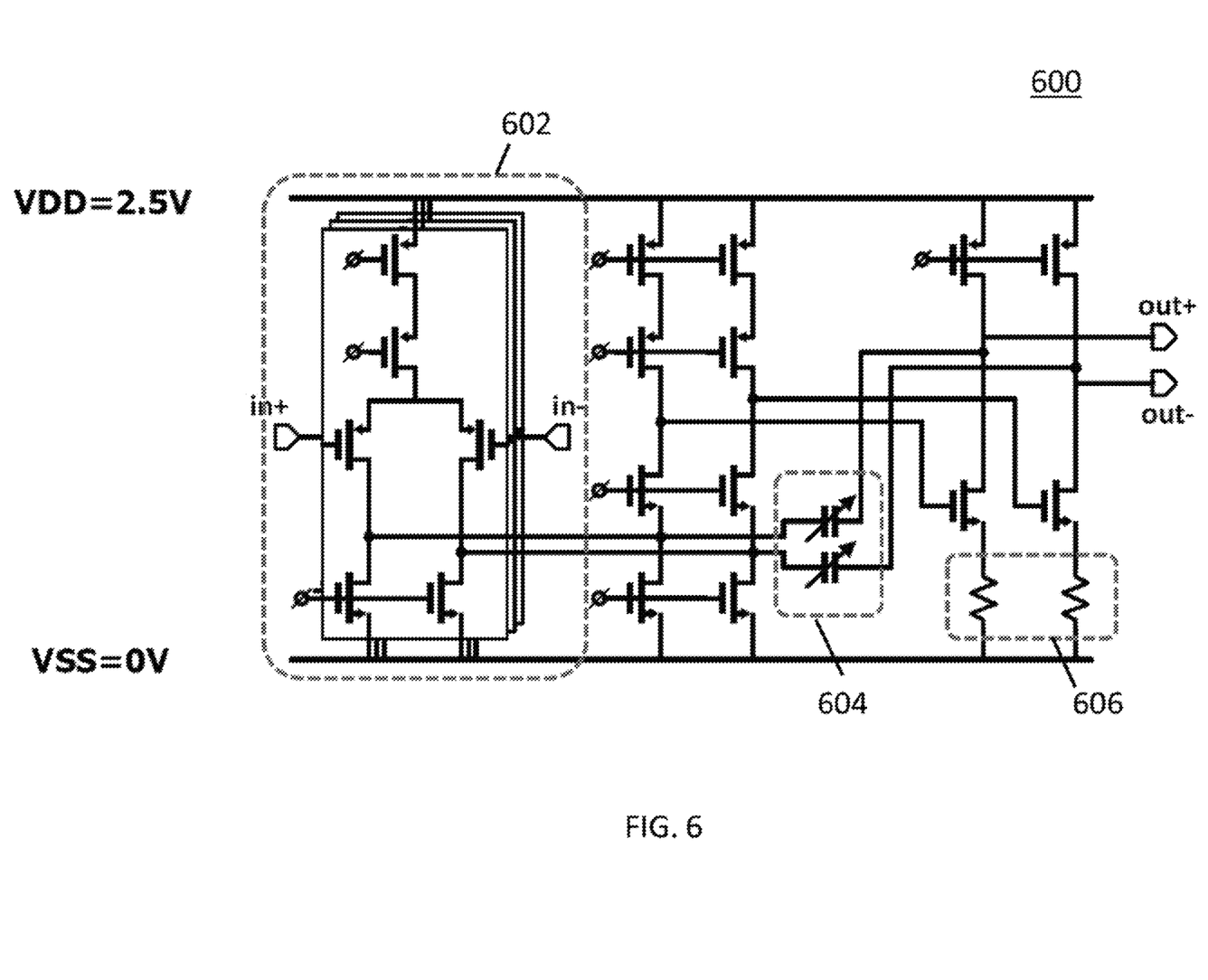
FIG. 6 shows an example of a variable operational amplifier in accordance with some embodiments.

FIG. 6 illustrates an example 600 of a circuit that can be used to provide a variable operational amplifier, such as the variable operational amplifiers (e.g., 134) shown in FIG. 1, in accordance with some embodiments. As shown, circuit 600 may include a programmable first stage transconductance Gm1 602. Variable compensation capacitances 604 can be adjusted from different values of Gm1. Resistors 606 can linearize the output stage and improve headroom of the first stage 602.

In some embodiments, any suitable mechanism can be user to power down any suitable parts of the circuits described herein when not needed. For example, in some embodiments, mechanisms can be provided to power down the TIAs and the LO generator circuit when not needed.

Although the invention has been described and illustrated in the foregoing illustrative embodiments, it is understood that the present disclosure has been made only by way of example, and that numerous changes in the details of embodiment of the invention can be made without departing from the spirit and scope of the invention, which is limited only by the claims that follow. Features of the disclosed embodiments can be combined and rearranged in various ways.

What is claimed is:

1. A circuit for a field-programmable noise cancelling wideband receiver front end, the circuit comprising:
a field programmable common source low noise transconductance amplifier (LNTA) having an input coupled to an input signal and producing a first output;
a field programmable common gate LNTA having an input coupled to the input signal and producing a second output;
a first four-phase I/Q mixer having an input coupled to the first output and producing first differential I outputs and first differential Q outputs;
a second four-phase I/Q mixer having an input coupled to the second output and producing second differential I outputs and second differential Q outputs;
a first transimpedance amplifier (TIA) having inputs coupled to the first differential I outputs and producing first differential TIA outputs;
a second TIA having inputs coupled to the first differential Q outputs and producing second differential TIA outputs;
a third TIA having inputs coupled to the second differential I outputs and producing third differential TIA outputs;
a fourth TIA having inputs coupled to the second differential Q outputs and producing fourth differential TIA outputs;
an I-path complex combiner that combines the first differential TIA outputs, the second differential TIA outputs, the third differential TIA outputs, and the fourth differential TIA outputs and that produces combiner I-path outputs; and
a Q-path complex combiner that combines the first differential TIA outputs, the second differential TIA outputs, the third differential TIA outputs, and the fourth differential TIA outputs and that produces combiner Q-path outputs.

2. The circuit of claim 1, wherein the field programmable common source LNTA comprises:
a plurality of parallel transconductance cells each having an input connected to the input signal and having an output; and
a cascode transistor having a gate, a drain, and a source, wherein the gate is connected to a cascode voltage, the drain provides the first output, and the source is connected to the outputs of the plurality of parallel transconductance cells.

3. The circuit of claim 2, wherein each of the plurality of parallel transconductance cells has a bias input coupled to a bias voltage that puts the cell in one of a class-AB mode, a class-C mode, and an OFF mode.

4. The circuit of claim 3, further comprising:
a first bias voltage generator that produces a class-AB bias voltage that puts at least one of the plurality of parallel transconductance cells into the class-AB mode.

5. The circuit of claim 4, further comprising:
a second bias voltage generator that produces a class-C bias voltage that puts at least another of the plurality of parallel transconductance cells into the class-C mode.

6. The circuit of claim 3, wherein each of the plurality of parallel transconductance cells comprises:
a capacitor having a first side connected to the input signal and a second side;
a first resistor having a first side connected to the bias voltage and a second side;
a transistor having a gate, a drain, and a source, wherein the gate is connected to the second side of the capacitor and the second side of the first resistor, and the drain is connected to the source of the cascode transistor; and
a second resistor having a first side connected to a fixed voltage level and having a second side connected to the source of the transistor.

7. The circuit of claim 1, wherein the field programmable common gate LNTA comprises:
a plurality of parallel transconductance cells each having an input connected to the input signal and having an output; and
a cascode transistor having a gate, a drain, and a source, wherein the gate is connected to a cascode voltage, the drain provides the second output, and the source is connected to the outputs of the plurality of parallel transconductance cells.

8. The circuit of claim 7, wherein the plurality of parallel transconductance cells each have a bias input connected to a bias voltage.

9. The circuit of claim 8, further comprising:
a first bias voltage generator that produces a class-AB bias voltage that puts at least one of the plurality of parallel transconductance cells into the class-AB mode.

10. The circuit of claim 9, further comprising:
a second bias voltage generator that produces a class-C bias voltage that puts at least another of the plurality of parallel transconductance cells into the class-C mode.

11. The circuit of claim 8, wherein each of the plurality of parallel transconductance cells comprises:
a transistor having a gate, a drain, and a source, wherein the gate is connected to the bias voltage, and the drain is connected to the source of the cascode transistor; and
a resistor having a first side connected to the input signal and having a second side connected to the source of the transistor.

12. The circuit of claim 1, wherein the first four-phase I/Q mixer is connected to four non-overlapping 25% duty cycle local oscillator signals.

13. The circuit of claim 12, wherein the second four-phase I/Q mixer is connected to the four non-overlapping 25% duty cycle local oscillator signals.

* * * * *